United States Patent
Feng et al.

(10) Patent No.: US 8,493,075 B2
(45) Date of Patent: Jul. 23, 2013

(54) METHOD AND APPARATUS FOR PREVENTING CIRCUIT FAILURE

(75) Inventors: Kai D. Feng, Hopewell Junction, NY (US); Jong-Ru Guo, Wappingers Falls, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 503 days.

(21) Appl. No.: 12/877,159

(22) Filed: Sep. 8, 2010

(65) Prior Publication Data

US 2012/0056667 A1     Mar. 8, 2012

(51) Int. Cl.
*G01R 31/00*     (2006.01)

(52) U.S. Cl.
USPC .......................................... 324/613

(58) Field of Classification Search
None
See application file for complete search history.

(56) References Cited

U.S. PATENT DOCUMENTS

| | | | |
|---|---|---|---|
| 5,394,294 A | 2/1995 | Mei et al. | |
| 5,739,570 A | 4/1998 | Ovens et al. | |
| 5,789,964 A | 8/1998 | Voldman | |
| 6,011,419 A | 1/2000 | Nowak et al. | |
| 6,043,662 A | 3/2000 | Alers et al. | |
| 6,124,163 A | 9/2000 | Shirley et al. | |
| 6,191,479 B1 | 2/2001 | Herrell et al. | |
| 6,385,565 B1 | 5/2002 | Anderson et al. | |
| 6,605,929 B2 | 8/2003 | Tsukagoshi et al. | |
| 6,751,184 B2 | 6/2004 | Anderson et al. | |
| 6,768,650 B2 | 7/2004 | Devey | |
| 6,777,972 B2 | 8/2004 | Roussel et al. | |
| 6,789,241 B2 | 9/2004 | Anderson et al. | |
| 6,844,771 B1 | 1/2005 | Chen | |
| 6,850,878 B2 | 2/2005 | Smith et al. | |
| 6,882,015 B2 * | 4/2005 | Bernstein et al. | 257/379 |
| 6,949,967 B2 * | 9/2005 | Wang et al. | 327/337 |
| 6,967,416 B2 | 11/2005 | Clevenger et al. | |
| 7,033,882 B2 | 4/2006 | Block et al. | |
| 7,080,337 B2 | 7/2006 | Tran | |
| 7,107,467 B2 | 9/2006 | Lee et al. | |
| 7,157,947 B2 | 1/2007 | Chansungsan et al. | |
| 7,227,211 B2 | 6/2007 | Tsutsumi et al. | |
| 7,231,625 B2 | 6/2007 | Dillon et al. | |

(Continued)

OTHER PUBLICATIONS

Weir et al., "Ultra-Thin Gate Dielectrics: They Break Down, But Do They Fail?", 1997 IEEE, pp. 4.1.1-4.1.4.

*Primary Examiner* — Paresh Patel
(74) *Attorney, Agent, or Firm* — Scully, Scott, Murphy & Presser, P.C.; Joseph P. Abate, Esq.

(57) ABSTRACT

An embedded decoupling capacitor wearout monitor for power transmission line, which can be integrated and fabricated in any standard CMOS or BiCMOS circuits. The embedded noise monitor is employed to detect the degraded capacitor and disable it from further operation, which will extend the operation lifetime of the circuit system and prevent subsequent catastrophic failure as a result of hard-breakdown (or capacitor short). In one aspect, the monitor circuit and method detects early degradation signal before catastrophic decoupling capacitor failure and, further can pin-point a degraded decoupling capacitor and disable it, avoiding impact from decoupling capacitor breakdown failure. The monitor circuit and method provides for decoupling capacitor redundancy and includes an embedded and self-diagnostic circuit for functionality and reliability.

25 Claims, 11 Drawing Sheets

U.S. PATENT DOCUMENTS

| | | |
|---|---|---|
| 7,301,320 B2 | 11/2007 | Dreps et al. |
| 7,355,429 B2 | 4/2008 | Jenkins et al. |
| 7,355,435 B2 | 4/2008 | Ferraiolo et al. |
| 7,414,459 B2 * | 8/2008 | Pisasale et al. ............... 327/543 |
| 7,456,063 B2 | 11/2008 | Byun et al. |
| 7,478,353 B2 | 1/2009 | Tran |
| 7,489,035 B2 | 2/2009 | Song et al. |
| 7,495,878 B2 | 2/2009 | Todd |

* cited by examiner

FRESH DECAP:

DEGRADED DECAP:

FAILED DECAP:

METHOD AND APPARATUS FOR PREVENTING CIRCUIT FAILURE

FIELD OF THE INVENTION

The present invention relates to semiconductor circuits generally, and specifically, a system and method for preventing circuit failures in integrated circuits.

BACKGROUND

High-frequency noise in power transmission is detrimental to the operation of a semiconductor circuit. Unfortunately, it is unavoidable due to the external sources of radiation and the nature of semiconductor devices. Besides utilizing a radiation shield for isolating external noise sources, decoupling capacitors have been widely employed to reduce noise or noise transmission over circuit or system power line. By introducing a low impedance path between power transmission line and system ground, decoupling capacitor attenuates high frequency noise in power line. Not only as a discrete component, decoupling capacitor is also integrated into large semiconductor chips. Typically, in a large integrated circuit different function blocks have their own integrated decoupling capacitors to minimize the noise influence over power line.

As decoupling capacitors are typically biased at full power supply voltage (Vdd) during circuit operation, their reliability or wearout has always been a concern. Particularly, with the introduction of deep-trench decoupling capacitor embedded in the silicon substrate, it is expected that its reliability becomes more critical due to the corners around the trench bottom as the weakest links for dielectric breakdown.

The wearout of decoupling capacitors is due to the degradation or breakdown of its dielectric materials, including hard-breakdown and soft-breakdown. The hard-breakdown of the capacitor causes electric short and thus results in failure of the whole circuit. Before hard-breakdown, the capacitor dielectric material always has to go through the soft-breakdown regime, which results in gradual increase in leakage current and noise level even though the capacitor still remains functional. The extra noises generated in the soft-breakdown regime spread over a wide frequency range, from a few Hz up to hundred Hz range, for example, as shown in the graph of FIG. 1 depicting an example plot 10 of 1/f noise spectra of gate current 12 both before soft breakdown and gate current 15 after soft breakdown of a 2 nm oxide of the decoupling capacitor. As shown, the noise level increases by 10,000× after soft breakdown that is detectable before catastrophic "hard breakdown". The increase of the noise caused by dielectric soft-breakdown has been shown in the reference entitled "Ultra-thin gate dielectrics: they break down, but do they fail?" by B. E. Weir et al. on International Electron Devices Meeting, 1997. Technical Digest., 7-10 Dec. 1997 pp: 73-76.

As illustrated in FIGS. 2A-2C, it is noted that a fresh decoupling capacitor 25A effectively removes high-frequency noise signals 27 from the supplied power line 30 leading to semiconductor circuitry 50; and, slightly degraded decoupling capacitors 25B in soft-breakdown regime are still functional in filtering high-frequency noise 27', since the low-frequency noise 28 resulted from soft-breakdown does not impact the semiconductor circuitry 50 significantly (see FIG. 2B). However, failed decoupling capacitors (decap), such as decap 25C that reach hard-breakdown regime cause catastrophic circuit failure of semiconductor circuitry 50 (see FIG. 2C) as power signals and high frequency noise 29 are shorted to ground 19 through the decap.

By measuring power line low frequency noise caused by dielectric soft-breakdown, the decoupling capacitor wearout can be monitored. However, there is no current technique or solution available to accurately sense the noise level in soft-breakdown period of the decoupling capacitor.

There are some teachings relating to power line noise sensing, such as described in U.S. Pat. No. 7,355,429 entitled "On-chip Power Supply Noise Detector," U.S. Pat. No. 7,355,435 entitled "On-chip Detection of Power Supply Vulnerability," U.S. Pat. No. 7,301,320 entitled "On-chip High Frequency Power Supply Noise Sensor," and U.S. Pat. No. 6,605,929 entitled "Power Supply Noise Sensor." However, all this prior art teaches measuring the voltage overshoots and/or undershoots, which do not represent the real noises of the power supply line. Hence, they are not suitable as representing wearout information of decoupling capacitors.

In addition, there are some prior arts related to decoupling capacitors, such as U.S. Pat. No. 7,227,211 entitled "Decoupling Capacitors and Semiconductor Integrated Circuit," and U.S. Pat. No. 6,011,419 entitled "Decoupling Scheme for Mixed Voltage Integrated Circuits." Again, none of these references deal with decoupling capacitor reliability or wearout issues.

It would be highly desirable to provide a system, method and circuit with ability to detect early signals before catastrophic capacitor failure, to pin-point worn-out capacitor(s) and to disable it(them), and avoiding impact from capacitor breakdown failure.

It would be further highly desirable to provide a system, method and circuit that provides for decoupling capacitor redundancy.

SUMMARY

There is provided a system and method for detecting the soft-breakdown of a decoupling capacitor before catastrophic capacitor failure. The system and method enables pin-point determining of worn-out capacitor(s) and to disable it (them), and avoiding impact from decoupling capacitor breakdown failure.

Thus, in one aspect, an embedded decoupling capacitor wearout monitor is provided for power transmission line of a semiconductor integrated circuit. The embedded noise monitor is employed to detect the degraded capacitor and disable it from further operation, which will extend the operation lifetime of the circuit system and prevent subsequent catastrophic failure as a result of hard-breakdown (or capacitor short).

There is further provided an on-chip or embedded decoupling capacitor wearout monitor circuit that implements a self-diagnostic method, to find the degraded decoupling capacitor and prevent it from causing further catastrophic damages on the operating system or other circuitry.

In one aspect, there is provided a decoupling capacitor (decap) wearout monitor for an integrated circuit (IC) device having a power transmission line supplying power to IC semiconductor circuits. The monitor comprises: a plurality of decoupling capacitors (decaps) embedded within the IC, each individual decap adapted to connect to the power transmission line in parallel with the circuits at a respective first terminal; a switch device responsive to a first control signal for selecting a target decap of the plurality for connection to the power transmission line and to couple noise signals present at the target decap to a noise monitor circuit embedded within the IC, the noise monitor circuit comprising: a noise sensor for generating from noise signals received from the target decap a corresponding constant voltage level signal;

and, a comparator device for comparing the constant voltage level signal with a determined threshold voltage level, and generating an output signal when a noise signal level exceeds the determined threshold voltage level; and, a control device embedded within the IC, responsive to the output signal for generating a second control signal to disconnect the target decoupling capacitor from the parallel circuit connection; and, further generating a further first control signal to connect a second target decoupling capacitor of the plurality in parallel with the circuits.

Further to aspect, there is provided a method for power line noise monitoring for an integrated circuit (IC) device having a power transmission line supplying power to IC semiconductor circuits. The method comprises: a) operably connecting, via a switch device responsive to a first control signal, a first target decoupling capacitor (decap) of a plurality of decoupling capacitors (decaps), embedded within the IC, to the power transmission line at a first terminal in a configuration parallel with the semiconductor circuits; b) continuously coupling noise signals present at the connected first target decap to a noise sensor embedded within the IC; c) generating, from noise signals coupled to the noise sensor, a corresponding constant voltage level signal; d) comparing, at a comparator device, the constant voltage level signal with a determined threshold voltage level; e) generating an output signal indicating a noise signal level exceeding the determined threshold voltage level; and, f) generating, at a control device embedded within the IC, responsive to the output signal, a second control signal for receipt by the switch device and operative to disconnect the first target decap from the parallel circuit configuration; and, further generating a first control signal to and switch device adapted to connect a second target decoupling capacitor of the plurality in a circuit configuration in parallel with the semiconductor circuits.

Further to this aspect, the method for power line noise monitoring further includes successive repeating steps b)-f) for the second target decap and for each further target decaps of the plurality of decaps thereafter.

In a further embodiment, there is provided a decoupling capacitor wearout monitor for an integrated circuit (IC) device having a power transmission line supplying power to one or more IC semiconductor circuit blocks. The monitor comprises: a decoupling capacitor(s) (decap(s)) embedded within the IC in association with a respective semiconductor circuit block(s), a respective decap having a first terminal for connection to the power transmission line in parallel with a respective semiconductor circuit block. That is, each CKT_i, is in parallel with a respective decap. A switch device is associated with each respective decap and connected at a respective second decap terminal thereof, each switch device responsive to a first control signal to initially couple each respective decap in parallel with its the individual semiconductor circuit block for simultaneous parallel operation, and simultaneously couple low frequency noise signals present at the decap to a noise monitor circuit embedded within the IC, the noise monitor circuit comprising: a noise sensor for generating from noise signals received from the target decap a corresponding constant voltage level signal; and, a comparator device for comparing the constant voltage level signal with a determined threshold voltage level, and generating an output signal when a noise signal level exceeds the determined threshold voltage level; and, a control device embedded within the IC, responsive to the output signal for determining a first target decap providing a source of the noise signal that exceeds the determined threshold voltage level, and, generating a second control signal for receipt by the associated switch device of the first target decap, to disconnect the first target decoupling capacitor from its associated individual semiconductor circuit block, while remaining decaps remain connected to their the respective individual semiconductor circuit blocks for continued parallel operation.

According to this further embodiment, there is provided a method for power line noise monitoring for an integrated circuit (IC) device having a power transmission line supplying power to IC semiconductor circuits. The method comprises: a) operably connecting, via a switch device responsive to a first control signal, a respective decoupling capacitor (decap) embedded within the IC to a respective one or more the semiconductor circuits at a first decap terminal for simultaneous parallel circuit operation; b) continuously coupling noise signals present at a second terminal of each respective the connected decap to a noise sensor embedded within the IC; c) generating, from noise signals coupled to the noise sensor, a corresponding constant voltage level signal; d) comparing, at a comparator device, the constant voltage level signal with a determined threshold voltage level; e) generating an output signal indicating a noise signal level exceeding the determined threshold voltage level; and, f) determining, at a controller device embedded within the IC, in response to a generated output signal, a target decap of the plurality that provides a source of the noise signal that exceeds the determined threshold voltage level; and, g) generating a second control signal for receipt at the switch and operative to decouple the target decap from the parallel circuit configuration while remaining decaps remain connected to their the respective individual semiconductor circuit blocks for continued parallel operation.

Further to this aspect, the method for power line noise monitoring includes successively iterating steps b)-g) to determine, at each iteration, a target decap to disconnect from its corresponding semiconductor circuit block, while remaining circuit blocks connected in circuit to its respective corresponding decap for continued parallel operation.

Advantageously, embedded semiconductor circuits sensitive to noisy power source can be disabled early on at the occurrence of degradation in the corresponding decoupling capacitors.

BRIEF DESCRIPTION OF THE SEVERAL
VIEWS OF THE DRAWINGS

Other aspects, features and advantages of the present invention will become more fully apparent from the following detailed description, the appended claims, and the accompanying drawings in which similar elements are given similar reference numerals.

Figure 1:
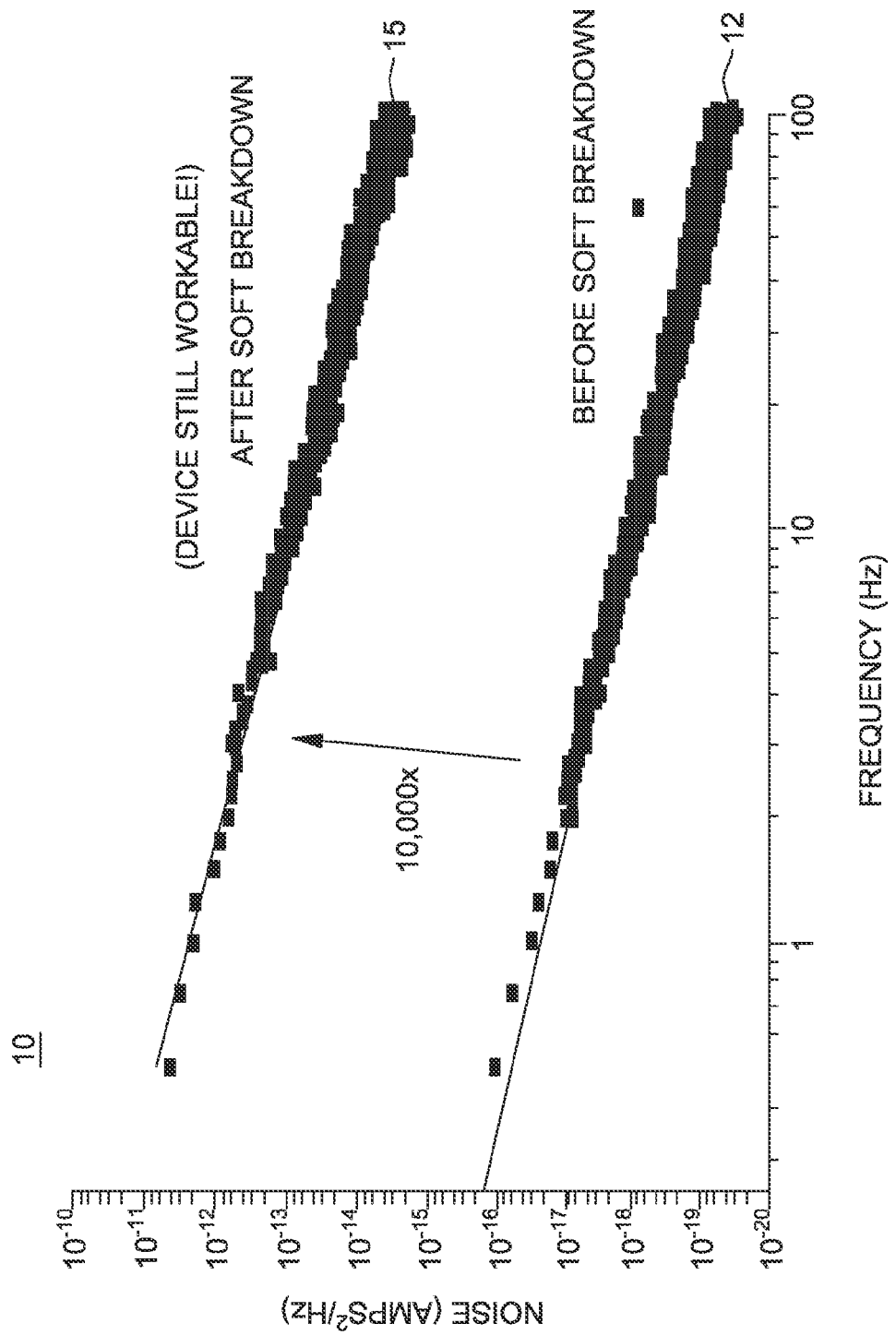
FIG. 1 illustrates an example plot 10 of 1/f noise spectra of gate current 12 both before soft breakdown and after soft breakdown of a 2 nm oxide of the decoupling capacitor according to prior art.
Figure 2A:
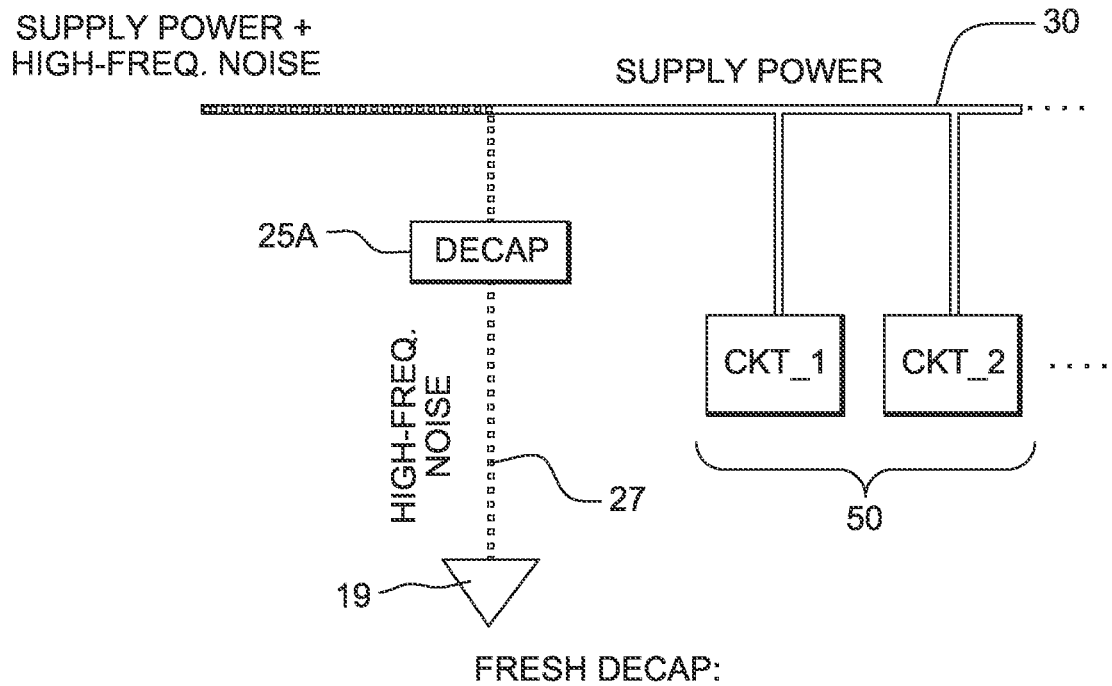
FIGS. 2A-2C illustrate example plots depicting conceptually operation of decoupling capacitor (decap) when fresh (FIG. 2A), when slightly degraded (FIG. 2B) and when failed (FIG. 2C) in accordance with one embodiment.
Figure 2B:
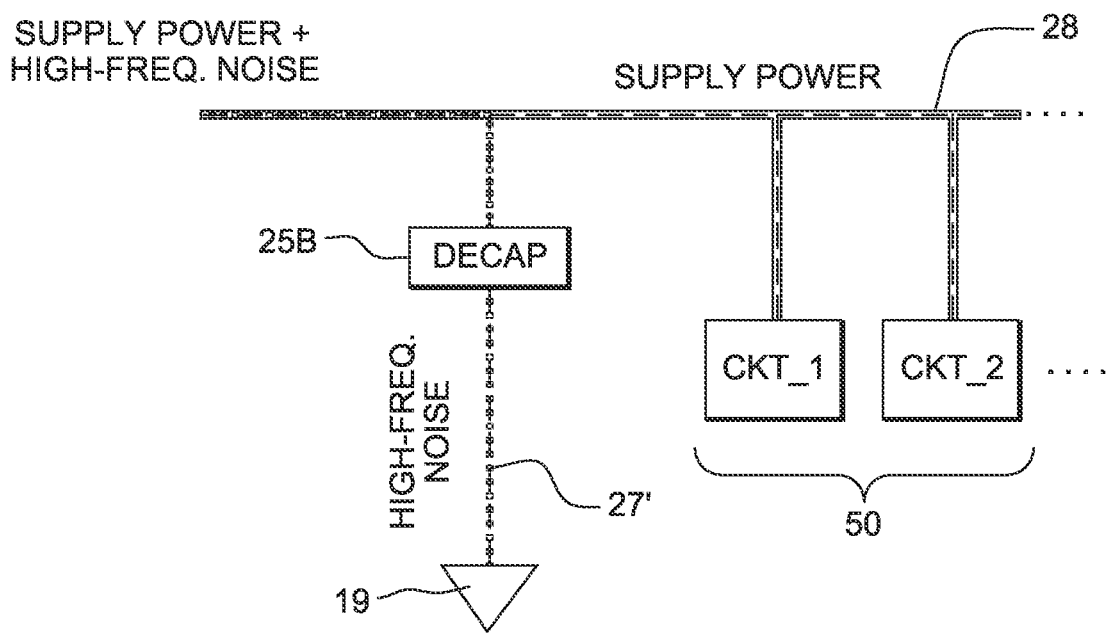
Figure 2C:
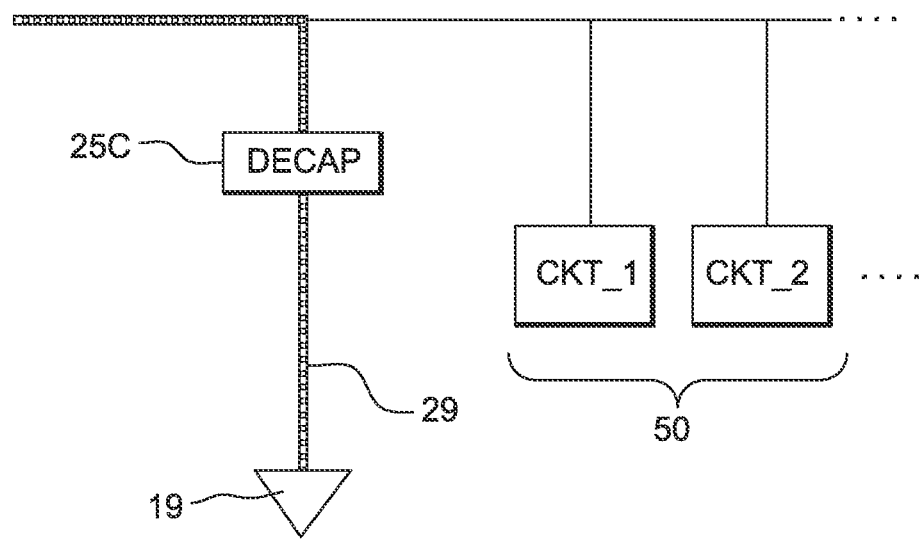
Figure 3:
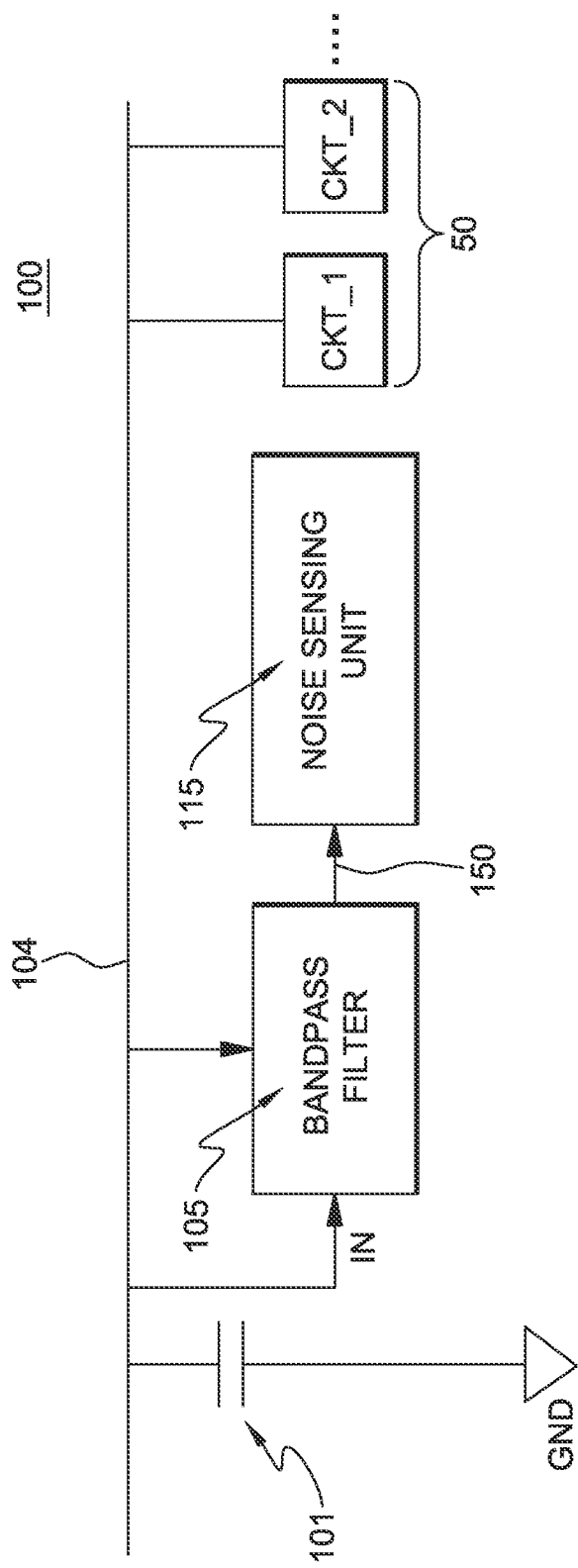
Figure 4:
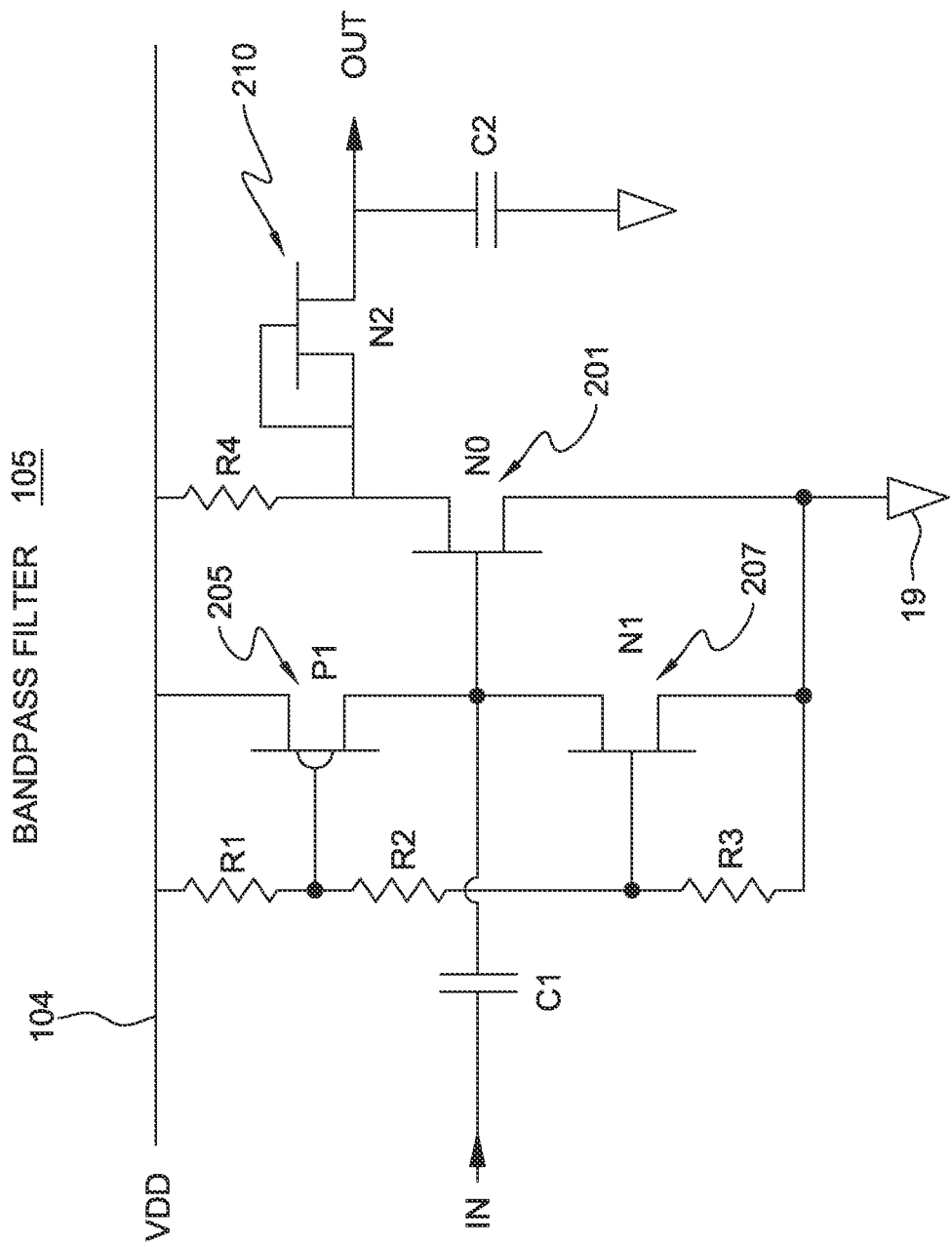
Figure 5:
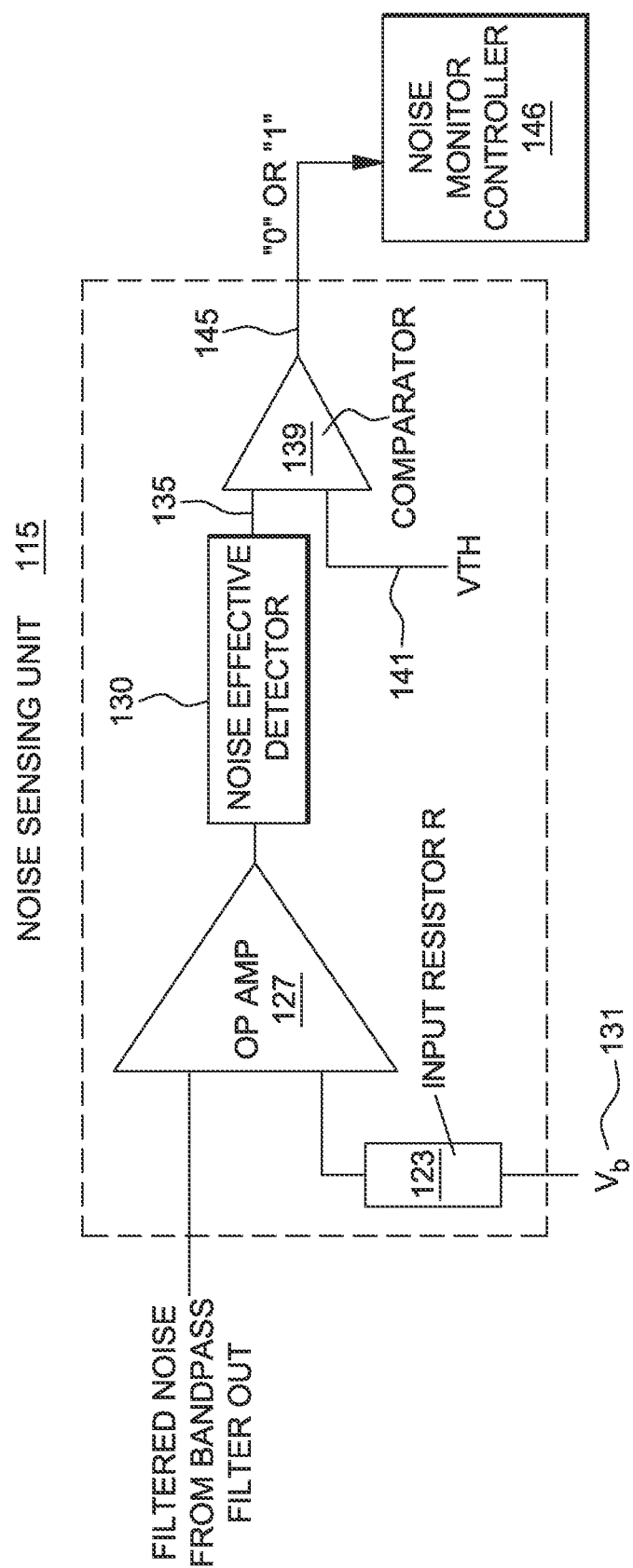
Figure 6:
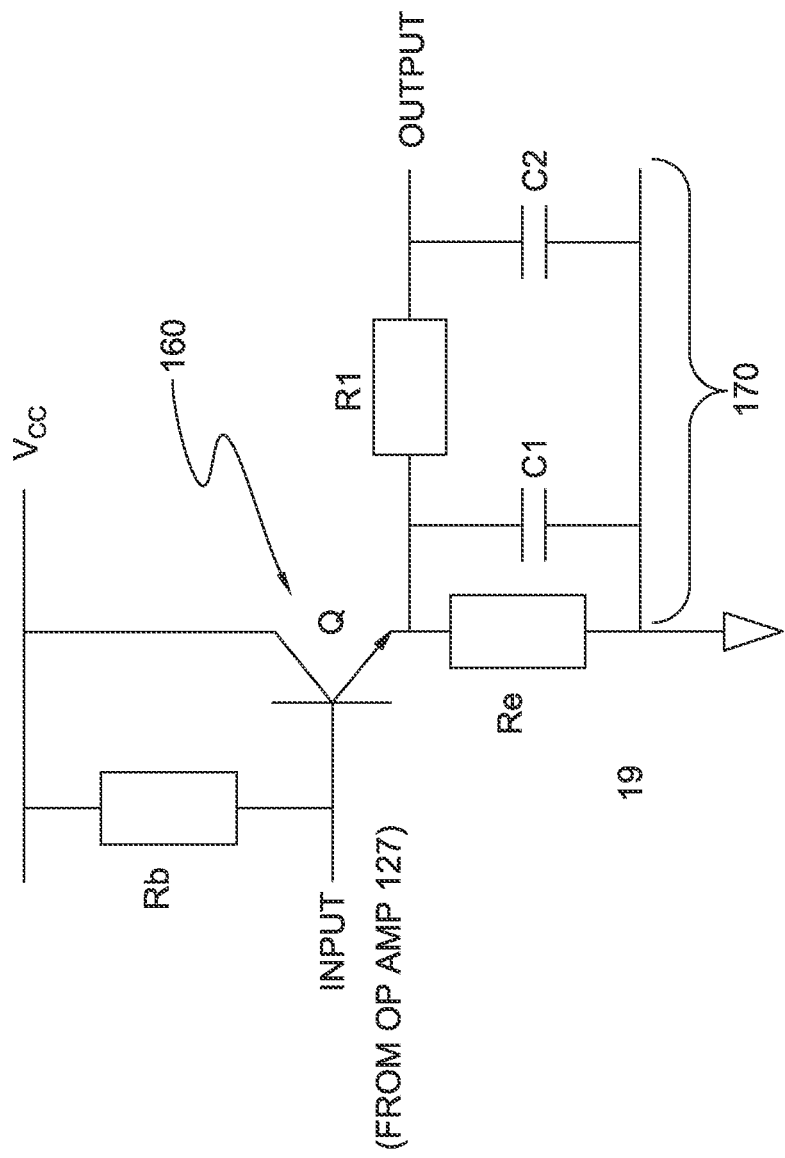
Figure 7:
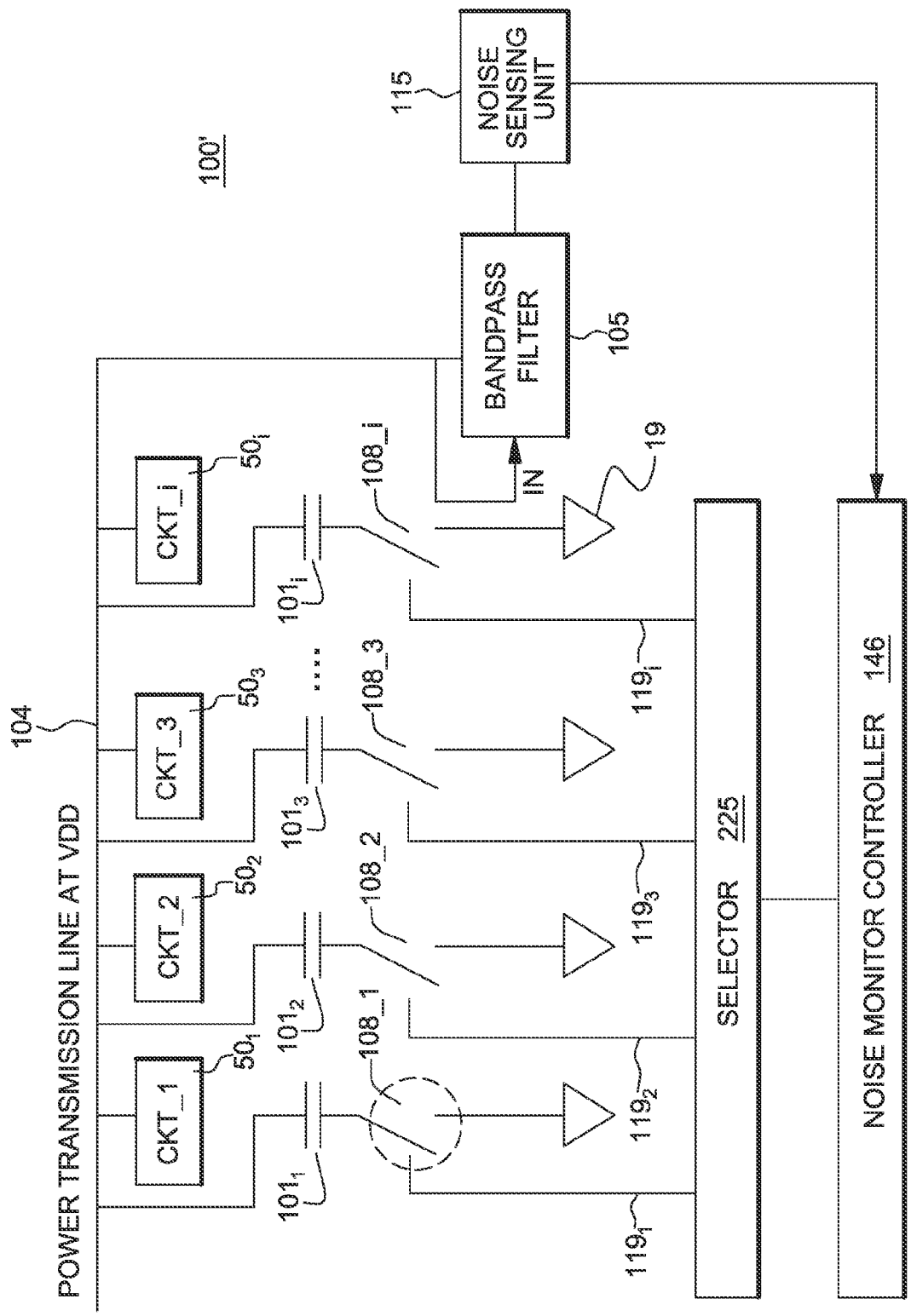
Figure 8:
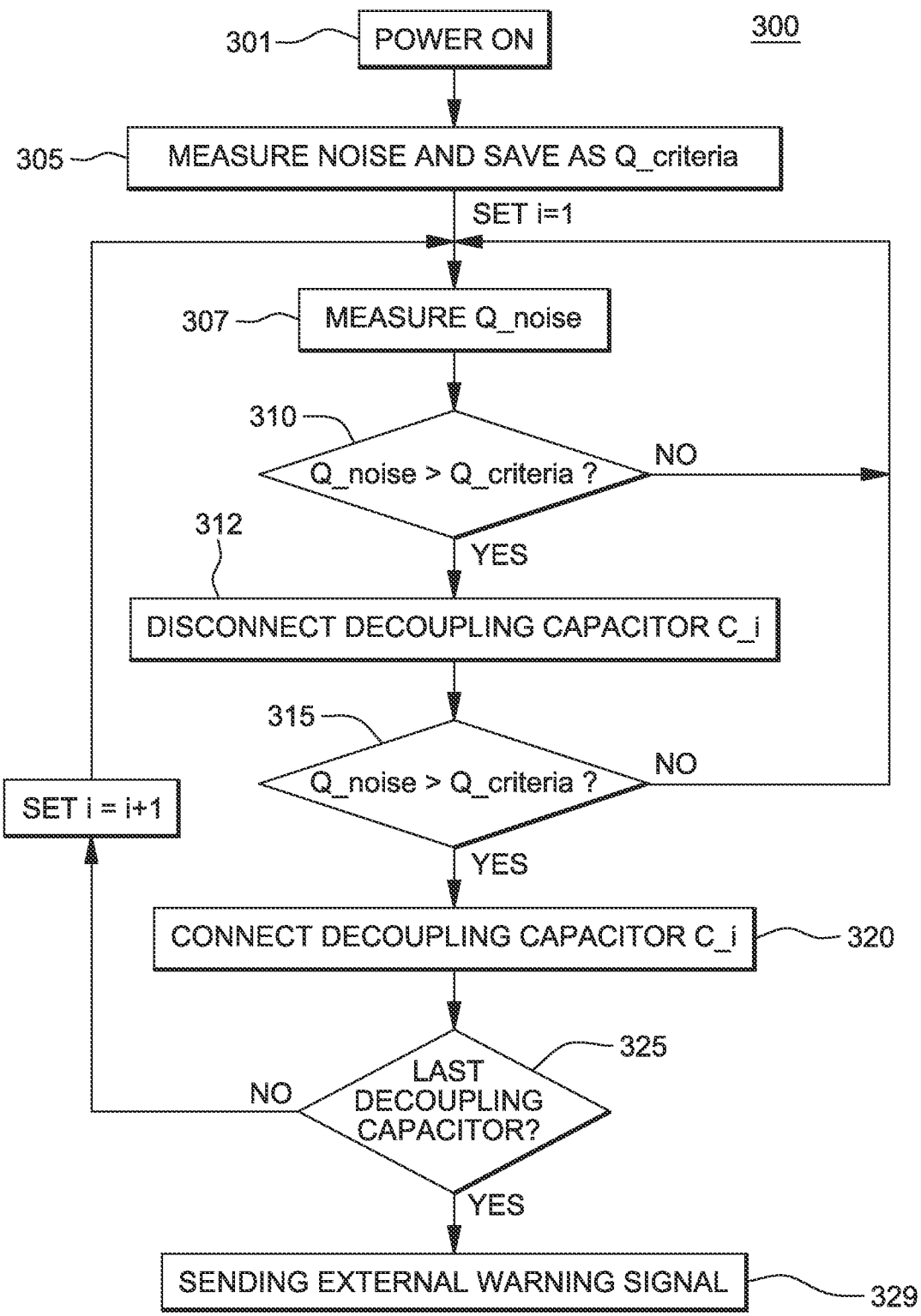
Figure 9:
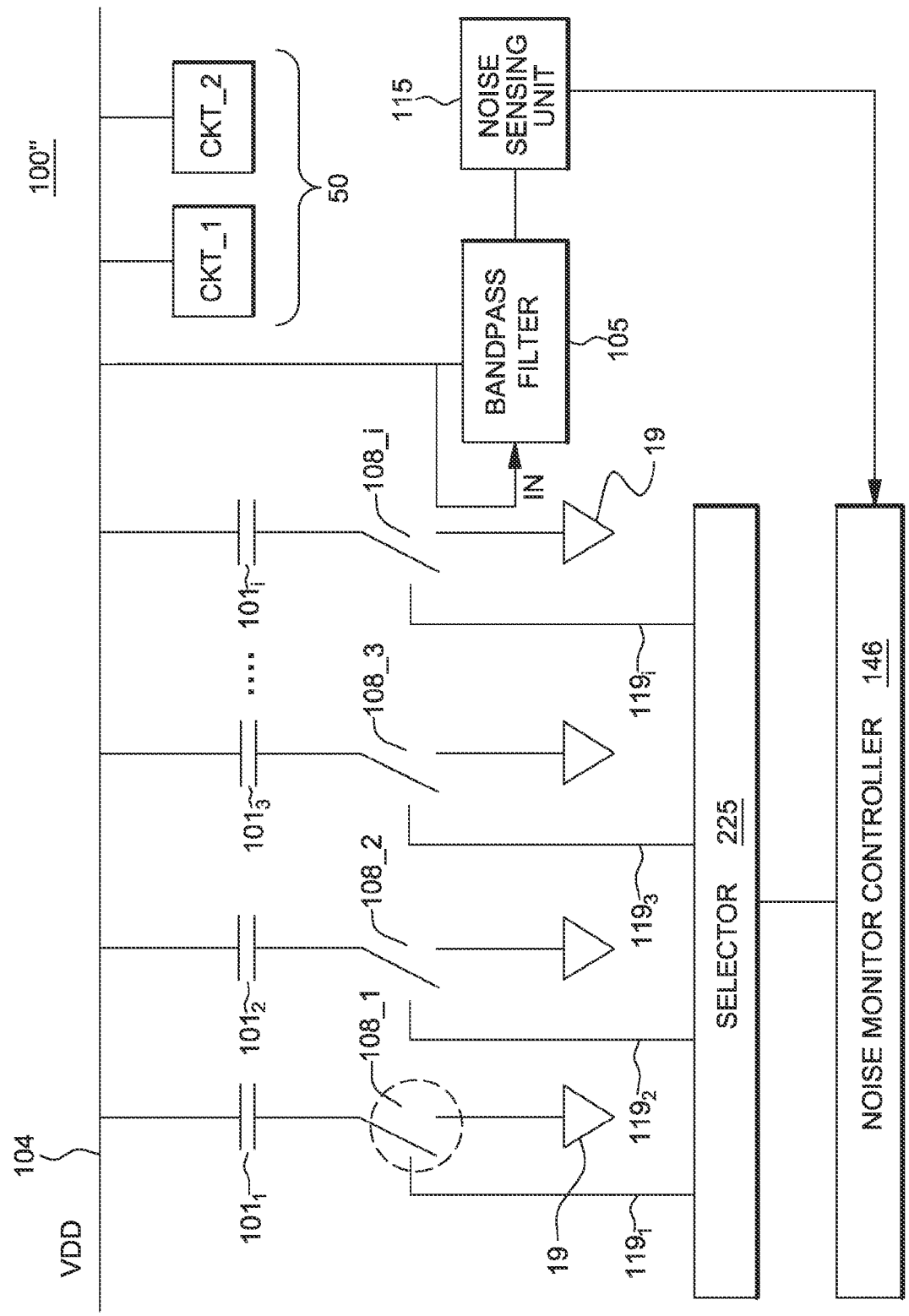
Figure 10:
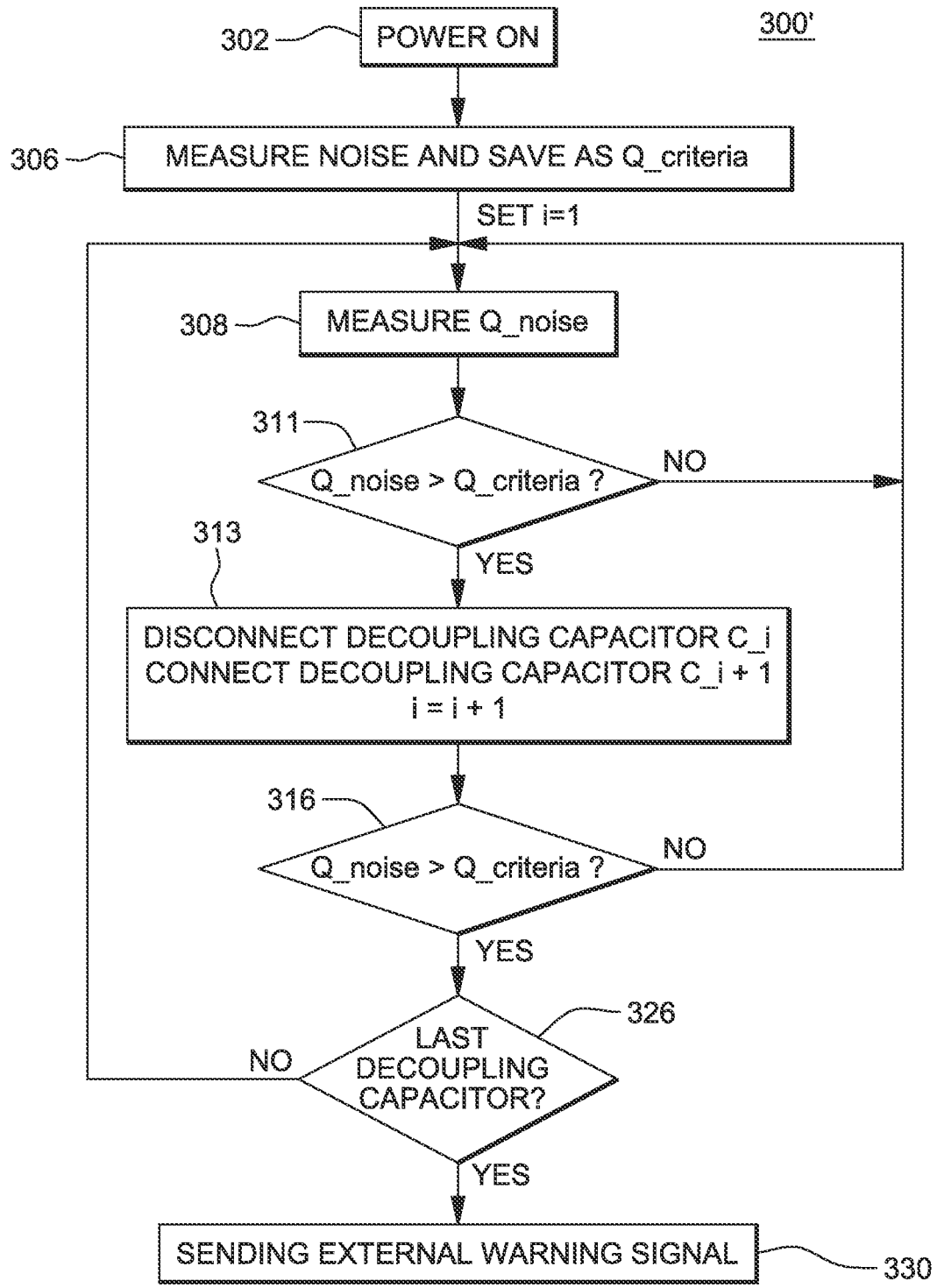

FIG. 3 illustrates the de-cap noise monitor 100 that is functionally situated in parallel with circuits 50 and a decap 101 to be monitored in accordance with one embodiment;

FIG. 4 illustrates a circuit schematic of an FET-device based active resistor implementation of band pass filter in accordance with one embodiment;

FIG. 5 depicts a block diagram schematic of the Noise Sensing Unit, wherein the noise from the decoupling capacitor 101 is coupled to from band pass filter element according to one embodiment;

FIG. 6 illustrates an example circuit schematic of the Noise Effective Detector (NED) according to one embodiment that receives the amplified noise signals from op amp according to one embodiment;

FIG. 7 depicts an embedded wearout monitor 100' for power line decoupling capacitors including noise monitor and diagnostic circuits according to one embodiment;

FIG. 8 depicts a flowchart illustrating an exemplary control method 300 implementing, in one embodiment, a diagnostic method for: (1) sensing of decoupling capacitor degradation; and (2) extending circuit lifetime by decoupling capacitor redundancy for the embodiment illustrated in FIG. 7;

FIG. 9 depicts an embedded wearout monitor 100" for power line decoupling capacitors including noise monitor and diagnostic circuits according to a further embodiment; and, FIG. 10 depicts a flowchart illustrating an exemplary control method 300' implementing, in one embodiment, a diagnostic method for extending circuit lifetime by decoupling capacitor redundancy for the embodiment illustrated in FIG. 9.

DETAILED DESCRIPTION

FIG. 3 illustrates the general circuit block diagram of the invention comprising an embedded wearout monitor 100 for power line decoupling capacitors ("de-cap"), such as the de-cap 101 connecting a power transmission line 104, e.g., having a voltage Vdd power source, for instance, to ground and utilized for protecting circuits 50 receiving power via said power transmission line. According to one aspect, as shown in FIG. 3, the de-cap noise monitor 100 is integrated and fabricated using any standard CMOS or BiCMOS circuitry using conventional lithography and semiconductor processing steps, and, is functionally situated in parallel with circuits 50 and the de-cap 101 to be monitored. In one embodiment, de-cap noise monitor 100 includes a band pass filter element or circuit element 105 and, a Noise Sensing Unit (NSU) 115, situated in parallel.

The Band pass Filter 105 is configured to pass a low frequency noise signal of interest and filter out the high frequency noise which is not generated by 101, and noise sensing unit 115 accurately monitors low-frequency noise in the transmission line 104 due to the aging of decoupling capacitor 101.

More particularly, the RC Band pass Filter 105 is designed to: (1) filter out DC component from the power line 104; (2) allow low frequency noise generated by a slightly degraded decoupling capacitor to enter Noise Sensing Unit (115); and (3) to filter out the high-frequency ripple from operating circuitry (such as switching circuits). Therefore, signals of only a range of frequency (e.g., from 100 Hz to 10K Hz) is allowed to pass through the Band pass Filter (105) into the Noise Sensing Unit (115). In order to implement such band pass filter into the integrated circuit, the associated resistance should be large, e.g., as high as about 100 Mohms, making it not feasible to use passive resistor. Therefore, FET-based active resistors are implemented in this filter to ensure such large resistance.

FIG. 4 depicts a circuit schematic of an FET-device based active resistor implementation of band pass filter 105. In FIG. 4, FET device 201 (e.g., NFET $N_0$) is a primary magnifying NFET device which is configured to operate under saturation mode for large gain. C1 and C2 are the capacitors in the filter, and in one embodiment, are at about 10 pF capacitance each. FET device 205 (e.g., PFET P1) and FET device 207 (e.g., NFET N1) form a gate bias voltage for FET $N_0$ 201. The input resistance of $N_0$, the source-drain resistances of PFET P1 205 and NFET N1 207 are all in parallel which together form the high pass filter with capacitor C1. The gate leakage current of $N_o$ is in the order of pA (picoampere), so that the filters equivalent resistance is on the order of 10 Gohms (10 giga ohms). The resistors R1, R2 and R3 in band pass filter 105 provide the gate voltages for FETs P1 205 and N1 207, and the resistances of the three resistors (R1, R2 and R3) are tuned to make both P1 205 and N1 207 operate under accumulation mode. In such situation, the drain currents of P1 and N1 are in the order of nano amperes (nA), and the equivalent resistances are on the order of 1 Gohms (1 giga ohms). Therefore the total resistance of the high pass filter can reach as high as about 100 Mohms. For the low pass filter, the resistor is a FET 210 (e.g., NFET N2) which has the drain and gate connected together so that it operates under saturation mode, e.g., with an equivalent resistance of about 1 Mohms.

Referring back to FIG. 3, the Band pass Filter element 105 situated in parallel between the power signal transmission line 104 and Noise Sensing Unit 115 screens out the unwanted signals and allows the filtered signal (low-frequency noise) component 150, representing the flicker noise of the decoupling capacitor, to pass through to the input of the Noise Sensing Unit 115.

FIG. 5 depicts a block diagram schematic of the Noise Sensing Unit 115, wherein the noise from the decoupling capacitor 101 shown in FIG. 3 is coupled to band pass filter element 105. The Noise Sensing Unit 115 particularly monitors low-frequency noise signals (e.g., at frequency ranging from 100 Hz-10K Hz). That is, in one embodiment, referring to FIG. 5, Noise Sensing Unit 115 includes an operational amplifier (op amp) element 127 having a single terminal for receiving input filtered noise from the Band pass Filter element 105, and, having a second terminal for receiving a reference voltage through resistor 123. In one embodiment, this resistor 123 receives a reference voltage Vb, that in one embodiment, is about Vdd/2 (where Vdd is the power source voltage that ranges, as an example but not limited to, between 0.5V and 5V), which makes the voltage across output coupling capacitor C2 (from band pass filter 105) much less than Vdd for longer operation. In one embodiment, the Bandgap Voltage reference Vb 131 is a stable voltage source to the OP Amp (107) and there are various other ways to supply a stable voltage to the circuit.

The output of the op amp element 127 is input to a Noise Effective Detector 130 which detects a noise level. The detector output signal 135 of Noise Effective Detector 130 is input to a first terminal of a comparator device 139 (which may be an operational amplifier configured as a comparator). A determined threshold voltage $V_{th}$ 141 is generated and applied to a second terminal of comparator device 139. The output signal 145 of comparator device 139 is a logic signal, either logic "1" of logic "0" dependent upon the noise level detected by the Noise Effective Detector 130 as compared to the reference voltage $V_{th}$. This logic level output signal 145 is input to a noise monitor controller device 146 and is associated with the monitored decap $C_i$.

More particularly, in view of FIG. 5, after coupling the filtered noise to the Noise Sensing Unit 115, the operational amplifier (op amp) 127 amplifies the noise to a certain voltage level for the Noise Effective Detector (NED) 130. NED 130 senses the amplified noise and outputs a range of DC voltages 135 for comparison with the Vth signal 141. In one embodiment, the Vth signal 141 is a pre-defined threshold voltage level, which, in one embodiment, represents the threshold noise level. This could be supplied by various ways, such as a regular voltage source which can be tuned in circuit to meet the exact application requirement. The preferred range of values are few hundreds milli-volts to half (½×) of the supply voltage for the Comparator 139.

For each decap $C_i$ if the detected noise level is higher than the Vth value, the comparator 139 outputs a logic level "1" signal, in one embodiment, to the Noise Monitor Controller circuit 146 which indicates a defective de-cap and instructs removal of the targeted decoupling capacitor(s) 101 shown in FIG. 3 from the circuit. In one embodiment, as will be described in greater detail below, removal of the targeted decoupling capacitor(s) 101 from the circuit is accomplished by a switch, such as MOSFET, e-fuse, MEMS switches, etc., in order to reduce the noise generated by this decoupling capacitor. If the sensed noise level is lower than the Vth, the comparator device 139 outputs "0" so that the targeted decoupling capacitor(s) $C_i$ stays on (i.e., is (are) not removed).

FIG. 6 illustrates an example circuit schematic of the Noise Effective Detector (NED) 130 according to one embodiment that receives the amplified noise signals from op amp 127. NED 130 includes an amplifier, e.g., a transistor. In one embodiment, the amplifier is embodied as a Bipolar Junction Transistor 160; however, other high impedance, high gain amplifier configurations could be used, e.g., a MOSFET transistor. In one embodiment, Bipolar Junction Transistor 160 is configured as a common-emitter amplifier, and having added resistors Rb (base resistor) and Re (emitter resistor). Collector terminal of BJT transistor 160 is tied to another power voltage source, Vcc in the embodiment shown, although it is understood that this may be Vdd (same voltage source).

In one aspect, the Noise Effective Detector (130) of FIGS. 5 and 6 is based on the concept of "pseudo-peak detector" that translates an AC noise signal to a DC voltage level. In one embodiment, the corresponding output DC voltage level is a fraction of the peak of the input AC signal. In one embodiment, the corresponding DC voltage level is about three quarters (¾) of the peak value of the AC noise when monitoring the noise level.

Operating in a common-emitter amplifier configuration, transistor 160 receives the input from the output of the op amp (127) and rectifies the signal and passes the signal as an output of a filter 170, shown in FIG. 6 that includes filter elements C1-R1-C2. In one embodiment, the resistors Rb and Re set the bipolar transistor Q in a non linear mode for the rectification, the C1-R1-C2 filter are of values designed to sense certain levels of voltages, such as three quarters (¾) and a quarter (¼) of the normal (e.g., peak) output of the common-emitter amplifier when configured without filter device.

A further embodiment of the embedded wearout monitor 100' for power line decoupling capacitors including noise monitor and diagnostic circuits is shown in FIG. 7. In the embodiment of FIG. 7, each decoupling capacitor (de-caps) $101_1, 101_2, 101_3, \ldots, 101_i$ is shown connected at one terminal to the power supply transmission line 104 and in parallel with a respective individual semiconductor circuit, e.g. $50_1, 50_2, 50_3, \ldots, 50_i$ intended to be protected. That is, each of the several decoupling capacitors $101_1, 101_2, 101_3, \ldots, 101_i$ are coupled, at one end, to the power transmission line 104 in parallel with a respective corresponding individual semiconductor circuit, e.g. $50_1, 50_2, 50_3, \ldots, 50_i$. At the other end of each de-cap $101_1, 101_2, 101_3, \ldots, 101_i$ there is connected a respective switch device, e.g., devices $108_1, 108_2, 108_3, \ldots, 108_i$, that is programmed, in response to control signals, to either couple the respective de-cap in or out of circuit, i.e., switch a decap 101, to/from the power transmission line 104, thereby configuring the decap either in parallel with its respective circuit $50_i$ or, decouple the respective de-cap $101_i$ from the power transmission line 104, thereby eliminating the decap from its parallel circuit connection with its respective circuit $50_i$. That is, the path to each decoupling capacitor $101_1, 101_2, 101_3, \ldots 101_i$ is controlled by a respective switching devices $108_1, 108_2, 108_3, \ldots, 108_i$, such as large size pMOSFET device, a MEMS switch device (i.e., a "Micro-Electro-Mechanical System" that includes one or more miniaturized mechanical switch structures integrated in the semiconductor chip), or e-fuse devices, and the like.

In one embodiment, a large size pMOSFET provides smaller turn-on impedance, compared with the impedance of the corresponding decoupling capacitors 101, so the turn-on impedance of pMOSFET can be ignored in the circuit. Therefore, the size of pMOSFET is determined by the impedance of the corresponding decoupling capacitor. It is understood that an nMOSFET may also be used for this purpose.

In the example embodiment depicted in FIG. 7, using pMOSFET devices as respective switches $108_1, 108_2, 108_3, \ldots, 108_i$, for example, each decap is connected or disconnected to an electrical ground 19 by appropriately biasing a gate 119 of the switch, e.g., a pMOSFET device, with a voltage appropriate to turn on or turn off switching devices $108_1, 108_2, 108_3, \ldots, 108_i$. For example, decoupling capacitor is coupled to the system 100 by biasing the gate of the pMOSFET device to ground (GND) voltage 19, and is decoupled by biasing the gate to power line voltage (Vdd) to switch off pMOSFET device. As shown in FIG. 7, each respective switch $108_1, 108_2, 108_3, \ldots, 108_i$ is controlled by a respective gate control signal $119_1, 119_2, 119_3, \ldots, 119_i$ that is provided by address selector circuit 225 in accordance with control signals generated as a result of executing logic in Noise Monitor Controller circuit 146.

For example, in one embodiment, each pMOSFET gate represented by elements $108_1, 108_2, 108_3, \ldots, 108_i$ is controlled by the Noise Monitor Controller 146 through the address Selector 225. The power line noise is measured by the Noise Sensing Unit 115 through Band pass Filter 105, and its output value is sent to the Noise Monitor Controller 146 for switching control. In particular, referring to FIG. 5, the logic value signal "0" or "1" output of the comparator element 139 is received by Noise Monitor Controller 146 for controlling the switching of a respective gate of an element $108_1, 108_2, 108_3, \ldots, 108_i$ to de-couple or remove the corresponding decap $C_i$. That is, for a respective de-cap $101_1, 101_2, 101_3, \ldots, 101_i$, as a result of the processing in band pass filter and noise sensing units, either a logic value signal "0" or "1" is output of the comparator. Responsive to the receipt of comparator output signal logic value signal "0" or "1" Noise Monitor Controller 146 implements logic for triggering generation of a respective switch signal $119_1, 119_2, 119_3, \ldots, 119_i$ for respectively controlling the gate of a respective switch element $108_1, 108_2, 108_3, \ldots, 108_i$ to either bias the de-cap off or let it remain functioning in the chip.

In particular, Noise Monitor Controller 146 (such as a configured shift register, decoder or micro-controller element) implements a control method for respectively controlling the respective switch element $108_1, 108_2, 108_3, \ldots, 108_i$. The selector 225 knows what switch to disable based on the index $C_i$, or simply the address corresponding to each capacitor stored in the controller.

FIG. 8 depicts a flowchart illustrating an exemplary method of self-diagnosis and a control method 300, implemented by the noise measurement circuit and effected by decoupling capacitors switches. That is, FIG. 8 depicts, in one embodiment, a diagnostic method for: (1) sensing of decoupling capacitor degradation; and (2) extending circuit lifetime by decoupling capacitor redundancy for the embodiment illustrated in FIG. 7.

The diagnostic method 300 to determine and de-couple worn-out decoupling capacitors is now shown in FIG. 8. In this method, every circuit (CKT) block "i" on the chip has its own corresponding decoupling capacitor ($C_i$). In the embodiment shown in FIG. 7, all $C_i$'s are initially connected to their corresponding CKT block by default for simultaneous parallel operation. When the low frequency noise detected exceeds the threshold, every $C_i$ is sequentially monitored by the disclosed circuit and method for early sign of degradation in each $C_i$. Once early degradation is detected, the $C_i$ is disabled (by opening the corresponding switch) and a warning signal sent before catastrophic failure.

In FIG. 8, at 301, the embedded wearout monitor circuit and system 100' is turned on. Initially, each of the respective switch element $108_1$, $108_2$, $108_3$, . . . , $108_i$ are activated or turned "on" to respectively simultaneously connect each decap/circuit combination to the noise monitoring circuitry of the embedded wearout monitor system 100'. As the method includes continuously monitoring a power line noise level, Q_noise, then, at 305, a first noise level of power transmission line 104 is measured and the value is stored as a noise level Q_criteria. That is, Q_criteria is obtained as the initial noise level of a fresh circuit (or system) when the circuit (or system) is powered on for the first time. Then, at 307, the Q_noise is constantly monitored (measured) by filter 105/noise sensing unit 115 statically once the system is powered on. Programmed logic initializes an index i, corresponding to monitored decap $C_i$, where initially, index i=1. Then, at 310, the monitored Q_noise level of transmission line is compared against the stored threshold value, Q_criteria, representing the maximum noise level that can be permitted during normal operation of the system. If, at 310, it is determined that the measured Q_noise is less than or equal to the Q_criteria, no action is needed, and the method returns to 307 where the noise monitor continues monitoring the power line noise level and performs the threshold comparison made at 310. In one aspect, the monitored noise level (Q_noise) is integrated over a preset time.

If at 310, it is determined that the measured Q_noise is greater than the Q_criteria, then at 312, the decoupling capacitor $C_i$ is disconnected from the system 100'. That is, if, at 310, the measured noise Q_noise value is greater than the criteria noise level Q_criteria, the decoupling diagnostic operation is triggered and starts to function.

For the embodiment of FIG. 7, where the integrated circuit is manufactured with more than one (plural) decoupling capacitors $101_1$, $101_2$, $101_3$, . . . , $101_i$ protecting circuitry coupled to the power transmission line in parallel, the diagnostic circuit turns off the decoupling capacitors $C_i$ one by one while continually monitoring the power line noise sequentially. That is, in one aspect, for the decap $C_i$ being diagnosed, in response to the measured Q_noise being greater than the Q_criteria, the system turns off the individual decoupling capacitor $C_i$ by controlling a gate of the corresponding switch element 108, by selector 225 operating under control of noise controller circuit 146. In one embodiment, the first $C_1$ is turned off.

Then, with $C_i$ decap decoupled from the system, at 315, a determination is again made whether the measured noise level Q_noise is greater than the determined threshold noise level Q_criteria. If at 315 the measured Q_noise level is determined not greater than the determined threshold noise level Q_criteria, the method returns to step 307 where the remaining decap noise level as passed through the bandpass filter element is again continuously monitored. That is, when Q_noise<Q_criteria, there is no need to repeat "power on", as the system keeps monitoring the noise level.

Otherwise, if at 315, after disconnecting decoupling capacitor $C_i$, it is determined that the measured Q_noise level is now greater than the determined threshold noise level Q_criteria, the process proceeds to step 320 where the decoupling capacitor $C_i$ is connected back in circuit. That is, after switching off decap $C_i$ at 312, if, at 315, it is determined that the Q_noise is now less than the Q_criteria, it is determined that the extra noise is from $C_i$. Consequently, the control circuit then disables $C_i$ and generates a warning signal. If, at 315, it is determined that Q_noise remains the same (i.e., greater than Q_criteria) after $C_i$ is disconnected, then at 320, $C_i$ will be turned back on and the diagnostic procedure will continue to 325, where a determination is made as to whether the $C_i$ is the last decap being processed. If it is determined that the $C_i$ is not the last decap in the chip, the decap index "i" is incremented (e.g., i=i+1) and the next decap $C_{i+1}$ is monitored by returning to step 307. Furthermore, in one embodiment, if at 315, Q_noise increases slightly after $C_i$ is switched off but still stays lower than Q_criteria, $C_i$ will be kept off and the diagnostic procedure will proceed to the next capacitor where logic implemented at steps 307, 310, 312, 315, 320 325 are repeated for all $C_i$. If all the decoupling capacitors have been checked and the noise level is still higher than the noise criteria level, the diagnostic procedure will generate an external signal for warning circuit (or system) failure at 329.

Thus, in methodology 300 shown in FIG. 8, steps 307 to 325 are performed continuously throughout the lifetime of the chip, under control of the noise monitor controller 146 until such time as the last decap is processed, where, in response to the last decap being processed, the noise control monitor will generate an external warning signal indicating which decap(s) $C_i$ have been the cause of the noise exceeding the determined threshold noise level Q_criteria.

A further embodiment of the embedded wearout monitor 100" for power line decoupling capacitors including noise monitor and diagnostic circuits is shown in FIG. 9. In this embodiment, there is configured multiple decaps for at least one CKT block for redundancy. Only one decap $C_i$ is initially connected via a respective switch to the CKT block by default. The connected $C_i$ is continuously monitored by the disclosed circuit and method for early sign of degradation. Once early degradation is detected, the degraded $C_i$ is disconnected and the next $C_i$ is connected for redundancy.

As shown in the embodiment of FIG. 9, decoupling capacitors de-caps $101_1$, $101_2$, $101_3$, . . . , $101_i$ are shown connected to power transmission line 104 in parallel with semiconductor circuitry 50 intended to be protected. Each of the several decoupling capacitors $101_1$, $101_2$, $101_3$, . . . , $101_i$ are coupled, at one end, to voltage power source Vdd at power transmission line 104. At the other end of each de-cap $101_1$, $101_2$, $101_3$, . . . , $101_i$ there is connected a respective switch device, e.g., devices $108_1$, $108_2$, $108_3$, . . . , $108_i$, that connects or disconnects the respective de-cap to electrical ground 19. Using pMOSFET devices as respective switches $108_1$, $108_2$, $108_3$, . . . , $108_i$, for example, a decoupling capacitor is turned on (i.e., coupled) by biasing the gate of the pMOSFET switch element to ground (GND) voltage 19, and is switched off (i.e., decoupled) by biasing the gate of the pMOSFET switch element to power line voltage (Vdd).

FIG. 10 depicts a flowchart illustrating a further method of self-diagnosis and a control method 300', implemented by the noise measurement circuit and effected by decoupling capacitors switches. That is, FIG. 10 depicts, in an alternate embodiment, a diagnostic method for: (1) sensing of decoupling capacitor degradation; and (2) extending circuit lifetime by decoupling capacitor redundancy for the embodiment illustrated in FIG. 9.

The diagnostic method 300' to determine and de-couple worn-out decoupling capacitors shown in FIG. 10 include steps 302, 306, 308 and 311 that correspond exactly to the steps 301, 305, 307 and 310 of the methodology depicted in FIG. 8. The only difference is that, in this embodiment, a single decap $C_i$ at a time is coupled in circuit at a time to provide protection for circuit 50. Thus, at 302, the embedded wearout monitor 100" circuit and system is turned on. Initially, only one of the respective switch elements $108_1, 108_2, 108_3, \ldots, 108_i$ are activated or turned "on" to couple a single de-cap $C_i$ (e.g., $101_1, 101_2, 101_3, \ldots, 101_i$) being diagnosed, to the noise monitoring circuitry of the embedded wearout monitor 100" system. For example, in FIG. 9, switch $108_1$ has coupled a first decap, e.g., decap $101_1$, to the noise monitor. As the method includes continuously monitoring a power line noise level, Q_noise, then, at 306, a first noise level of power transmission line 104 is measured and the value is stored as a noise level Q_criteria. That is, Q_criteria is obtained as the initial noise level of a fresh circuit (or system) when the circuit (or system) is powered on for the first time. Then, at 308, the Q_noise is continuously monitored (measured) by filter 105/noise sensing unit 115 statically once the system is powered on. Programmed logic implemented the method of FIG. 10, has set an index i=1, where index i=1 represents the initial coupled decap $C_1$. At 311, the monitored Q_noise level is compared against the obtained threshold value, Q_criteria, representing the maximum noise level than can be permitted during normal operation of the system. If, at 311, it is determined that the measured Q_noise is less than the Q_criteria, no action is needed, and the method returns to 308 where the noise monitor continues monitoring the power line noise level and performs the threshold level comparison at 311. In one aspect, the monitored noise level (Q_noise) is integrated over a preset time.

If at 311, it is determined that the measured Q_noise is greater than the Q_criteria, then at 313, this indicates that the first decap $C_i$ (e.g., i=1) being diagnosed is the potential source of the noise (indicating potential decap wear) and, at 313, the decoupling capacitor $C_i$ is disconnected from the system 100" at 313. Thus, for the actual de-cap $C_i$ being diagnosed, in response to the measured Q_noise being greater than the Q_criteria, in one embodiment, the system turns off the individual decoupling capacitor $C_i$ by controlling a gate of the corresponding switch element $108_i$ (e.g., i=1) by selector 225 operating under control of noise controller circuit 146 receiving indication for the monitored $C_i$.

Continuing, in the embodiment of FIG. 10, where the integrated circuit is manufactured with more than one (plural) embedded decoupling capacitors $101_1, 101_2, 101_3, \ldots, 101_i$ protecting semiconductor circuitry 50, in addition to decoupling the diagnosed decoupling capacitor $C_i$ (i=1) at 313 when the measured Q_noise is greater than the Q_criteria, the system further initiates coupling a next second decap $C_i$ (i=i+1), e.g., $C_2$, to the system 100". Then the process continues to 316 where again the level of monitored power line noise is compared to the Q_criteria threshold. At 316, if the measured Q_noise is not greater than the Q_criteria, the process returns to 308 and 311 where the Q_noise is continually monitored until such time as the measured Q_noise again becomes greater than the Q_criteria, when, at 313, the next redundant actual de-cap $C_i$ (e.g., i=2) being diagnosed is turned off by controlling a gate of the corresponding switch element $108_i$ by selector 225 operating under control of noise controller circuit 146. In addition to decoupling the diagnosed decoupling capacitor $C_i$ (i=2) at 313 when the measured Q_noise is greater than the Q_criteria, the system initiates coupling a next decap $C_i$ (i=1+1), e.g., decap $C_3$, to the system 100" before proceeding to 316 where again the level of monitored power line noise is compared to the Q_criteria threshold.

At 316, after decap $C_i$ is switched off and next redundant decap $C_{i+1}$ is switched on, if it is determined that Q_noise is less than Q_criteria, the diagnostic procedure will repeat steps 308, 311, 313 and continue monitoring the noise level of the next coupled decap $C_{i+1}$ until such time as Q_noise is greater than Q_criteria. Otherwise, at 316, if determined that Q_noise is greater than Q_criteria, the process proceeds to 326 where a determination is made as to whether the last decap has been processed. If the last decap has not been processed, the process proceeds back to 308 where the decap noise level is again continuously monitored at steps 308, 311, 313.

Thus, in methodology 300' shown in FIG. 10, steps 308 to 326 are performed continuously throughout the lifetime of the chip, under control of the noise monitor controller 146 until such time as the last decap is processed, where, at 330, in response to the last decap being processed, the noise control monitor will generate an external warning signal indicating which or all decap(s) C_i have been the cause of the noise exceeding the determined threshold noise level Q_criteria. For example, if all the decoupling capacitors have been checked and the noise level is still higher than the criteria level, the diagnostic procedure will generate at 330 an external signal for warning circuit (or system) failure.

Although a few examples of the present invention have been shown and described, it would be appreciated by those skilled in the art that changes might be made in these embodiments without departing from the principles and spirit of the invention, the scope of which is defined in the claims and their equivalents.

What is claimed is:

1. A decoupling capacitor (decap) wearout monitor for an integrated circuit (IC) device having a power transmission line supplying power to IC semiconductor circuits, said apparatus comprising:
   a plurality of decoupling capacitors (decaps) embedded within said IC, each individual decap adapted to connect to said power transmission line in parallel with said circuits at a respective first terminal;
   a switch device responsive to a first control signal for selecting a target decap of said plurality for connection to said power transmission line and to couple noise signals present at said target decap to a noise monitor circuit embedded within said IC, said noise monitor circuit comprising:
   a noise sensor for generating from noise signals received from said target decap a corresponding constant voltage level signal; and,
   a comparator device for comparing said constant voltage level signal with a determined threshold voltage level, and generating an output signal when a noise signal level exceeds said determined threshold voltage level; and,
   a control device embedded within said IC, responsive to said output signal for generating a second control signal to disconnect said target decoupling capacitor from said parallel circuit connection; and, further generating a further first control signal to connect a second target decoupling capacitor of said plurality in parallel with said circuits.

2. The decap wearout monitor as claimed in claim 1, wherein said noise monitor circuit further comprises: a first filter device for receiving noise signals directly from a coupled target decap via a respective switch device and outputting received noise signals within a pre-determined frequency range.

3. The decap wearout monitor as claimed in claim 2, wherein said first filter device comprises a bandpass filter tuned to receive noise voltage signals within a predetermined frequency range.

4. The decap wearout monitor as claimed in claim 3, wherein said predetermined frequency range is between 100 Hz and 100 kHz.

5. The decap wearout monitor as claimed in claim 2, wherein said control device further comprises: a selector device, responsive to said generated output signal, for providing said respective first control signal and second control signal to a target switch device associated with each target decap for respectively connecting or disconnecting a respective target decap in parallel with said semiconductor circuits.

6. The decap wearout monitor as claimed in claim 2, wherein said noise sensor comprises:
an amplifier device for amplifying said monitored noise signals passed through said filter device; and,
an effective noise detector device for receiving said amplified monitored noise signals and generating therefrom said corresponding constant voltage level.

7. The decap wearout monitor as claimed in claim 6, wherein said effective noise detector device comprises:
a second filter device configured to sense one or more voltage levels of said amplified monitored noise signals and, forming, from a sensed voltage level, said corresponding constant voltage level signal.

8. The decap wearout monitor as claimed in claim 2, wherein said switch device is one of a MOSFET transistor device, a micro electromechanical (MEM) switch, or an e-fuse device.

9. A method for power line noise monitoring for an integrated circuit (IC) device having a power transmission line supplying power to IC semiconductor circuits, said method comprising:
a) operably connecting, via a switch device responsive to a first control signal, a first target decoupling capacitor (decap) of a plurality of decoupling capacitors (decaps), embedded within said IC, to said power transmission line at a first terminal in a configuration parallel with said semiconductor circuits;
b) continuously coupling noise signals present at said connected first target decap to a noise sensor embedded within said IC;
c) generating, from noise signals coupled to said noise sensor, a corresponding constant voltage level signal;
d) comparing, at a comparator device, said constant voltage level signal with a determined threshold voltage level;
e) generating an output signal indicating a noise signal level exceeding said determined threshold voltage level; and,
f) generating, at a control device embedded within said IC, responsive to said output signal, a second control signal for receipt by said switch device and operative to disconnect said first target decap from said parallel circuit configuration; and, further generating a first control signal to and switch device adapted to connect a second target decoupling capacitor of said plurality in a circuit configuration in parallel with said semiconductor circuits.

10. The method for power line noise monitoring as claimed in claim 9, further including: successive repeating steps b)-f) for said second target decap and for each further target decaps of said plurality of decaps thereafter.

11. The method for power line noise monitoring as claimed in claim 10, wherein at a respective second terminal of each target decap there is connected an associated respective switch device, said method further comprising: providing said respective first control signal and second control signal to a respective switch device associated with each decap for respectively connecting a respective target decap in said parallel circuit configuration with said semiconductor circuits or, disconnecting a respective target decap from said parallel circuit configuration.

12. The method for power line noise monitoring as claimed in claim 9, further comprising: filtering, through a first filter device, noise signals of a pre-determined frequency range directly from a coupled target decap for coupling to said embedded noise sensor.

13. The method for power line noise monitoring as claimed in claim 12, further comprising:
amplifying said filtered noise signals passed through said first filter device; and,
receiving said amplified filtered noise signals and generating therefrom said corresponding constant voltage level.

14. The method for power line noise monitoring as claimed in claim 13, further comprising:
sensing, by a second filter device, one or more voltage levels of said amplified filtered noise signals, and forming, from a sensed voltage level, said corresponding constant voltage level signal.

15. The method for power line noise monitoring as claimed in claim 13, wherein said determined threshold level corresponds to a noise threshold indicative of excessive decap wear.

16. A decoupling capacitor wearout monitor for an integrated circuit (IC) device having a power transmission line supplying power to one or more IC semiconductor circuit blocks, said apparatus comprising:
a decoupling capacitor (decap) embedded within said IC in association with a respective semiconductor circuit block, a respective decap having a first terminal for connection to said power transmission line;
a switch device associated with each respective decap and connected at a respective second decap terminal thereof, each said switch device responsive to a first control signal to initially couple each respective decap to said power transmission line for simultaneous parallel operation, and simultaneously couple noise signals present at each said decap to a noise monitor circuit embedded within said IC, said noise monitor circuit comprising:
a noise sensor for generating from noise signals received from a target decap a corresponding constant voltage level signal; and,
a comparator device for comparing said constant voltage level signal with a determined threshold voltage level, and generating an output signal when a noise signal level exceeds said determined threshold voltage level; and,
a control device embedded within said IC, responsive to said output signal for determining a first target decap providing a source of said noise signal that exceeds said determined threshold voltage level, and, generating a second control signal for receipt by said associated switch device of said first target decap, to disconnect said first target decoupling capacitor from said power transmission line, while remaining decaps remain connected to said power transmission line in parallel with their said respective individual semiconductor circuit blocks for continued parallel operation.

17. The decap wearout monitor as claimed in claim 16, wherein said noise monitor circuit further comprises: a first filter device for receiving noise signals directly from said individually connected decaps via a respective switch device and outputting received noise signals within a pre-determined frequency range.

18. The decap wearout monitor as claimed in claim 17, wherein said first filter device comprises a bandpass filter tuned to receive noise voltage signals within a predetermined frequency range.

19. The decap wearout monitor as claimed in claim 17, wherein said noise sensor comprises:
   an amplifier device for amplifying said monitored noise signals passed through said filter device; and,
   an effective noise detector device for receiving said amplified monitored noise signals and generating therefrom said corresponding constant voltage level.

20. The decap wearout monitor as claimed in claim 19, wherein said effective noise detector device comprises:
   a second filter device configured to sense one or more voltage levels of said amplified monitored noise signals and generate from a sensed voltage level forming said corresponding constant voltage level signal.

21. The decap wearout monitor as claimed in claim 16, wherein said control device further comprises: a selector device, responsive to said generated output signal, for providing said respective first control signal and second control signal to a respective switch device associated with each decap for respectively connecting or disconnecting a respective decap to said power transmission line.

22. A method for power line noise monitoring for an integrated circuit (IC) device having a power transmission line supplying power to IC semiconductor circuits, said method comprising:
   a) operably connecting, via a switch device responsive to a first control signal, a respective decoupling capacitor (decap) embedded within said IC to said power transmission line at a first decap terminal for simultaneous parallel circuit operation;
   b) continuously coupling noise signals present at said power transmission line to a noise sensor embedded within said IC;
   c) generating, from noise signals coupled to said noise sensor, a corresponding constant voltage level signal;
   d) comparing, at a comparator device, said constant voltage level signal with a determined threshold voltage level;
   e) generating an output signal indicating a noise signal level exceeding said determined threshold voltage level; and,
   f) determining, at a controller device embedded within said IC, in response to a generated output signal, a target decap of said plurality that provides a source of said noise signal that exceeds said determined threshold voltage level; and,
   g) generating a second control signal for receipt at said switch and operative to decouple said target decap from said parallel circuit configuration while remaining decaps remain connected to said power transmission line in parallel with their said respective individual semiconductor circuit blocks for continued parallel operation.

23. The method for power line noise monitoring as claimed in claim 22, successive iterating steps b)-g) to determine, at each iteration, a target decap to disconnect from its corresponding semiconductor circuit block, while remaining circuit blocks connected in circuit to its respective corresponding decap for continued parallel operation.

24. The method for power line noise monitoring as claimed in claim 22, wherein said determining step f) comprises:
   h) initializing an index value i of a target decap $C_i$;
   i) disconnecting said target decap $C_i$ from said power transmission line;
   j) determining, with target $C_i$ decap disconnected from the power transmission line, whether the measured noise level still remains greater than the determined threshold voltage level; and, one of:
   if the measured noise level is determined not greater than the determined threshold voltage level, returning to step b); otherwise, if the measured noise level is determined greater than the determined threshold voltage level, then performing:
   k) re-connecting said target decap $C_i$ back to said power transmission line;
   l) obtaining a modified index value "i", and
   repeating steps i)-l) for a next target decap $C_i$.

25. The method for power line noise monitoring as claimed in claim 24, wherein at a respective second terminal of each target decap $C_i$, there is connected an associated respective switch device, said method further comprising: providing a respective first control signal and second control signal to a respective switch device associated with each decap for respectively connecting a respective target decap to said power transmission line in parallel with its corresponding parallel operating circuit block or, disconnecting a respective target decap $C_i$ from said power transmission line.

\* \* \* \* \*